(12) United States Patent
Dong et al.

(10) Patent No.: US 9,835,664 B2
(45) Date of Patent: Dec. 5, 2017

(54) MICROWAVE ANTENNAS FOR EXTREMELY LOW INTERFERENCE COMMUNICATIONS SYSTEMS

(71) Applicant: TONGYU COMMUNICATION INC., Zhongshan (CN)

(72) Inventors: Junwei Dong, Zhongshan (CN); Pengyu Chen, Zhongshan (CN); Xiaolin Lv, Zhongshan (CN)

(73) Assignee: TONGYU COMMUNICATION INC., Zhongshan (CN)

( * ) Notice: Subject to any disclaimer, the term of this patent is extended or adjusted under 35 U.S.C. 154(b) by 462 days.

(21) Appl. No.: 13/983,199

(22) PCT Filed: May 29, 2013

(86) PCT No.: PCT/CN2013/076436
§ 371 (c)(1),
(2) Date: Aug. 1, 2013

(87) PCT Pub. No.: WO2014/190514
PCT Pub. Date: Dec. 4, 2014

(65) Prior Publication Data
US 2014/0354492 A1 Dec. 4, 2014

(51) Int. Cl.
*G01R 29/08* (2006.01)
*G01R 29/10* (2006.01)
*H01Q 19/02* (2006.01)
*H01Q 19/13* (2006.01)
*H01Q 1/42* (2006.01)

(52) U.S. Cl.
CPC ........... *G01R 29/10* (2013.01); *H01Q 19/023* (2013.01); *H01Q 19/027* (2013.01); *H01Q 19/134* (2013.01); *H01Q 1/42* (2013.01)

(58) Field of Classification Search
CPC ........ H01Q 19/12; H01Q 1/50; H01Q 19/134; H01Q 19/023; H01Q 19/027; H01Q 1/42; G01R 29/10
USPC ............... 343/781 P, 781 CA, 836, 840, 703
See application file for complete search history.

(56) References Cited

U.S. PATENT DOCUMENTS

| | | | |
|---|---|---|---|
| 4,272,769 A * | 6/1981 | Young | H01Q 19/19 343/781 P |
| 5,973,654 A | 10/1999 | Lusignan et al. | |
| 6,011,521 A * | 1/2000 | Knop et al. | 343/781 P |
| 6,094,174 A * | 7/2000 | Knop | 343/781 P |
| 6,211,834 B1 * | 4/2001 | Durham et al. | 343/781 P |
| 6,697,028 B1 * | 2/2004 | Gothard et al. | 343/781 CA |
| 7,898,491 B1 * | 3/2011 | Curran et al. | 343/781 P |

FOREIGN PATENT DOCUMENTS

| | | |
|---|---|---|
| CN | 101267062 | 9/2008 |
| CN | 102570050 | 7/2012 |

* cited by examiner

*Primary Examiner* — Brian Young
(74) *Attorney, Agent, or Firm* — Hamre, Schumann, Mueller & Larson, P.C.

(57) ABSTRACT

Microwave antennas having optimized performance are provided. The microwave antennas include a primary reflector having effective foci arranged in a generally circular or elliptic range around a central axis thereof, and a matching component filling a hole at a bottom center portion thereof. The structural parameters of the microwave antenna are tuned by an aperture field analysis method to optimize the overall performance.

15 Claims, 14 Drawing Sheets

MICROWAVE ANTENNAS FOR EXTREMELY LOW INTERFERENCE COMMUNICATIONS SYSTEMS

FIELD OF TECHNOLOGY

The embodiments disclosed herein relate generally to a microwave communications system. More specifically, the embodiments describe a microwave antenna for a microwave communications system and a method for optimizing performance of a microwave antenna.

BACKGROUND

Microwave antennas are widely used in communications systems. To characterize the performance of a microwave antenna, the European Telecommunications Standards Institute (ETSI) has defined a few classes based on radiation patterns of the antenna, including parameters of, for example, front-to-back ratio (F/B), side lobe level (SLL), envelope, etc. The currently known and available antennas in the market include ETSI class 2 and class 3 categories. Antennas of class 4 category require greater suppression for F/B and SLL and require extremely low interference compared to the class 2 and 3 categories.

SUMMARY

The embodiments described herein relate to a microwave communications system. In particular, the embodiments describe microwave antennas for a microwave communications system with optimized configurations and methods for optimizing the performance of the microwave antennas.

In some embodiments, the microwave antennas include a primary reflector having effective foci displaced from a central axis thereof, and a matching component disposed at a center bottom portion of the primary reflector to fill a hole thereof.

Traditional methods have found cumbersome when optimizing the performance of microwave antennas in the ETSI class 4 category. The embodiments described herein can be provide low interference antennas compliant with ETSI class 4 standards or better.

The embodiments described herein provide optimized microwave antennas and methods for optimizing the overall performance of a microwave antenna. The embodiments described herein can be used in any application to establish, for example, point-to-point communications, point-to-broadcast communications, etc. The embodiments described herein can also be adapted to serve low interference purposes of satellite communications, radar systems, etc.

In one embodiment, a microwave antenna for a microwave communications system is provided. The microwave antenna includes an antenna feed configured to transmit/receive microwave signals, and a primary reflector having a concave surface facing the antenna feed and configured to reflect the microwave signals from/to the antenna feed. The antenna feed is positioned at a central axis of the concave surface. The primary reflector has an open edge that defines an aperture through which the microwave signals transmitted into or out of the microwave antenna. The location of the antenna feed with respect to the primary reflector is determined according to an aperture field distribution of the microwave signals across the aperture. The concave surface is a substantially parabolic-shaped surface having effective foci offset from the central axis of the concave surface.

In one embodiment, a microwave antenna for a microwave communications system includes an antenna feed configured to transmit/receive microwave signals, and a primary reflector having a concave surface facing the antenna feed and configured to reflect the microwave signals from/to the antenna feed. The antenna feed is positioned at a central axis of the concave surface. The primary reflector having an open edge that defines an antenna aperture at an open end thereof and a hole defined at a bottom center portion thereof opposite to the open end. The concave surface is a substantially parabolic surface having effective foci displaced from the central axis. A waveguide extends between a first end and a second end thereof along the central axis where the first end is connected to the antenna feed, and the second end extends through the hole of the primary reflector. The waveguide is configured to transmit/receive microwave signals to/from the antenna feed. A matching component fills the hole of the primary reflector and facing the antenna feed, and the waveguide extends through the matching component.

In another embodiment, a method for optimizing performance of a microwave antenna, includes: estimating one or more structural parameters of the microwave antenna; calculating, using the estimated structural parameters as an input, an aperture field distribution of microwave signals transmitted by the microwave antenna across an aperture of the microwave antenna, the aperture field distribution including an amplitude distribution and a phase distribution, the calculation is implemented by a computer; and adjusting the structural parameters of the microwave antenna according to the calculated aperture field distribution.

BRIEF DESCRIPTION OF THE DRAWINGS

Referring now to the drawings in which like reference numbers represent corresponding parts throughout.

DETAILED DESCRIPTION

The embodiments described herein relate to microwave antennas for microwave communications systems. In particular, the embodiments describe microwave antennas having optimized configurations and methods for optimizing the performance of microwave antennas.

The embodiments described herein provide optimized microwave antennas and methods for optimizing the performance of a microwave antenna. In some embodiments, the microwave antennas include a primary reflector having effective foci displaced from a central axis thereof, and a matching component disposed at a center bottom portion of the primary reflector.

The embodiments described herein can be used in any application to establish point-to-point communications, point-to-broadcast communications. The embodiments described herein can also be adapted to serve low interference purposes of satellite communications and radar systems, etc.

Figure 1:
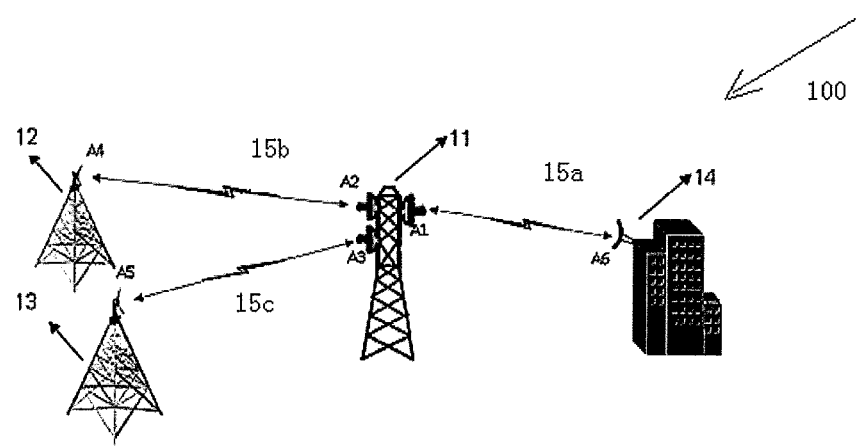
FIG. 1 illustrates a perspective view of a microwave communications system, according to one embodiment.

FIG. 1 shows a perspective view of a microwave communications system 100 that includes multiple antennas A1-A6. The system 100 includes tower stations 11, 12, 13 and one station 14 on a building. The antennas A1-A3 are positioned on the station 11. The stations 12, 13 and 1 each have one microwave antenna, A4, A5 or A6. As shown in FIG. 1, microwave links 15a-15c are established between the antennas A1 and A6, A2 and A4, and A3 and A5, respectively. The stations 11-14 can establish point-to-point communications through the respective microwave antennas A1-6. It is to be understood that the number of microwave antennas is not limited to six.

The microwave links 15a-15c can maintain a low interference therebetween, which largely depends on the quality of the microwave antennas A1-A6. For instance, the antennas A1 and A2 nearly locate back-to-back on the station 11 that is on a tower. In order to achieve low interference, the antennas A1 and/or A2 have very low backward energy spill-over performance. Similarly, the antennas A2 and A3 locate adjacent to each other. Taking the antenna A3 for example, in order to minimize the undesired energy received from the antenna A4, the antenna A3 is configured to have a very low radiation envelope toward the direction pointing to the antenna A4. In general, the quality of interference between adjacent antennas can be characterized by the front-to-back (F/B) ratio, and the side lobe level (SLL) of respective radiation patterns of the antennas. In the embodiments described herein, the microwave antennas can achieve an F/B ratio of 75 dB or better, and/or a SLL of about 18 to 75 dB or better. The microwave antennas with such superior quality can be applied in extremely crowed environments many microwave antennas have to be deployed adjacent to one another.

In some embodiments, the communications system 100 can be a 4G Long Term Evolution (LTE) communication channel, a 3G channel for voice, video, internet duplex links, etc.

Figure 2:
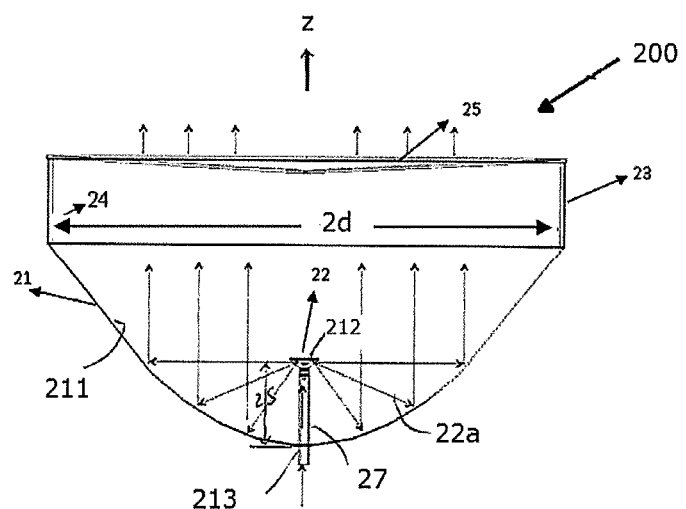
FIG. 2 illustrates a cross sectional view of a microwave antenna, according to one embodiment.

FIG. 2 illustrates a cross sectional view of a microwave antenna 200. The antenna 200 includes a primary reflector 21 and an antenna feed 22. The antenna 200 further includes an absorber 24 and a radome 25. The primary reflector 21 has a parabolic shape surface 211 facing the antenna feed 22. The parabolic surface 211 has an effective focus (not shown) disposed at a central axis Z thereof. The antenna feed 22 is connected to one end of a waveguide 27. The waveguide 27 extends along the central axis Z. The distance between the antenna feed 22 and the vertex 213 of the parabolic surface 211 is 2s. A foci-to-diameter ratio of the antenna 200 is defined as the ratio between the focal length (e.g., 2s) and the diameter 2d of the parabolic surface 211. The foci-to-diameter ratio can be used to measure how deep the primary reflector 21 is. In general, the smaller the foci-to-diameter ratio, the deeper the primary reflector 21.

The microwave antenna 200 can be a transmitting or receiving device. In the following, its working principle is explained from a transmitting point of view. During operation, electromagnetic energy can be fed into the antenna 200 via the waveguide 27 and the antenna feed 22. The energy propagates, and is converted into directed waves pointing toward the parabolic surface 211 of the primary reflector 21 along the dashed line direction 22a. The energy then gets reflected by the primary reflector 21 to form plane waves that can penetrate through the radome 25 and eventually transmit into free space.

Traditional methods of designing a microwave antenna, such as the antenna 200 of FIG. 2, are to study the radiation pattern of the feed 22 via, for example, optimizing the overall radiation property by means of experiments. During experiments, tuning factors usually include the height of the shroud 23, the thickness of the absorber 24, the geometry of the radome 25, etc. These traditional methods have certain disadvantages, such as, for example, hard to determine the limit of antenna performance accurately, low working efficiency of carrying out research and development, etc.

Figure 3:
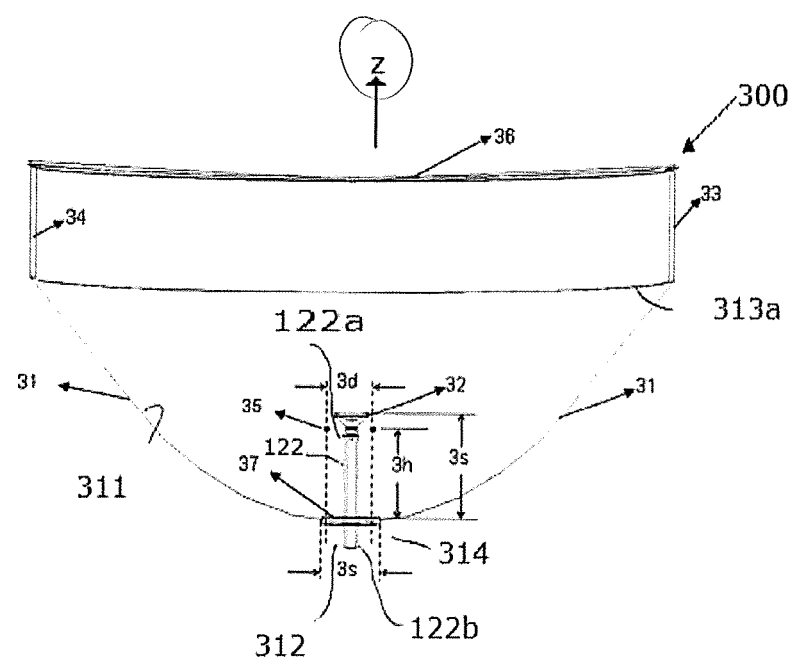
FIG. 3 illustrates a cross sectional view of a microwave antenna, according to one embodiment.

FIG. 3 illustrates a cross sectional view of a microwave antenna 300 for a microwave communications system, according to one embodiment. The microwave antenna 300 includes an antenna feed 32 configured to transmit/receive microwave signals, and a primary reflector 31 having a concave surface 311 facing the antenna feed 32 and configured to reflect the microwave signals from/to the antenna feed 32. The antenna feed 32 is positioned at a central axis Z' of the concave surface 311.

In one embodiment, the concave surface 311 can be a substantially parabolic shape surface having effective foci 35 displaced or offset with respect to the central axis Z'. As shown in FIG. 3, the effective foci 35 are positioned to form a generally circular range around the central axis Z' with a diameter 3d. It is to be understood that the effective foci 35 can be displaced or offset from the central axis Z' and positioned in other shapes that can be determined by the shape of the concave surface 311. The effects of such foci displacement or offset on the performance of the antenna 300 will be discussed further below.

In some embodiments, the effective foci 35 can be in a suitable shape other than a round shape, for example, when a radiation pattern of the antenna requires asymmetric performance at different planes, e.g., an E-plane and an H-plane, or when certain application requires elliptic pattern contours, especially in satellite communications.

In one embodiment, the concave surface 311 can be a surface of revolution that is formed by rotating a curve (generatrix) around the central axis Z'. The generatrix can be, for example, a parabola curve have halves separated at the vertex thereof with a displacement of 3d in the direction perpendicular to the central axis Z. The formed surface of revolution can have effective foci that are displaced from the central axis Z. It is to be understood that the shape of the concave surface 311 can be modified to deviate from a surface of revolution. In some embodiments, the concave surface 311 can be modified to be non-circular shape, e.g., a generally elliptic shape that can be applied in certain satellite communications where the radiation pattern requires non-circular gain counter, e.g. an elliptic shape.

The primary reflector 31 includes a hole 312 defined at a bottom center portion 314 thereof. The hole 312 has a generally circular shape. It is to be understood that the hole 312 can be other suitable shapes. A waveguide 122 extends between a first end 122a and a second end 122b along the central axis Z' of the concave surface 311. The first end 122a is connected to the antenna feed 32 and the second end 122b extends through the bottom center portion 314 of the primary reflector 31. The waveguide 122 is configured to transmit/receive microwave signals to/from the antenna feed 32.

Figure 3A:
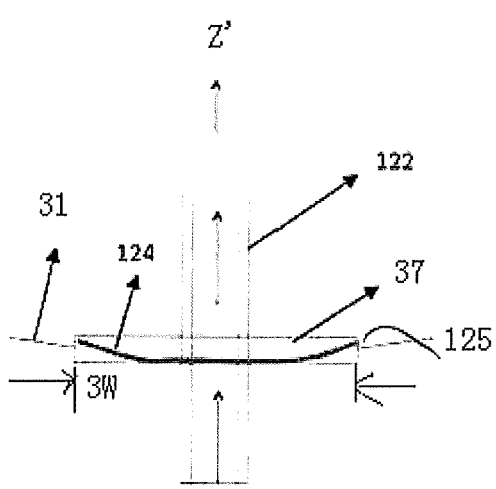
FIGS. 3a, 3b and 3c illustrate the matching component of FIG. 3, according to three embodiments.
Figures 3B, 3C:
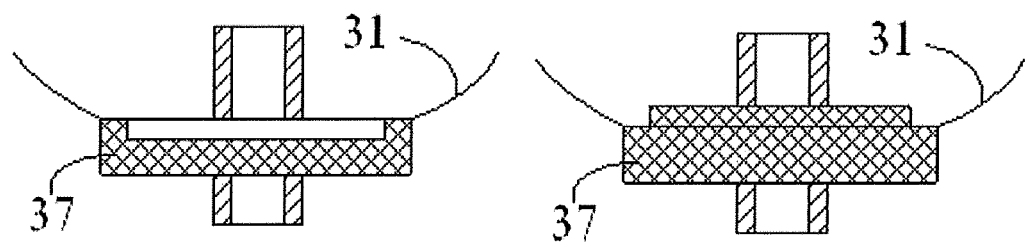

The microwave antenna 300 further includes a matching component 37 filling the hole 312 at the bottom center portion 314 of the primary reflector 31. The matching component 37 has a diameter of 3W. FIG. 3a illustrates the matching component 37, according to one embodiment. As a preferred embodiment, the matching component 37 as shown in FIG. 3b has a groove; the matching component 37 as shown in FIG. 3c is provided with a bump. The matching component 37 has a cross-sectional profile 124 that is concaved toward the antenna aperture 313a of FIG. 3. The cross-sectional profile 124 can include linear or nonlinear, smooth or stepped lines. As shown in FIG. 3, a discontinuity or a step 125 is formed between the matching component 37 and the primary reflector 31. It is to be understood that the matching component 37 and the primary reflector 31 can be connected to form a smooth inner surface facing the feed 32.

As shown in FIG. 3, the matching component 37 has an effective height as marked by the distance 3h to the effective foci 35. The distance 3h is measured from a top surface of the matching component 37 to the effective foci 35 along the axis Z'. The distance between the top surface of matching component 37 and the antenna feed 32 along the axis Z' is 3s. The effects of the matching component 37 on the performance of the antenna 300 will be discussed further below.

Figure 4:
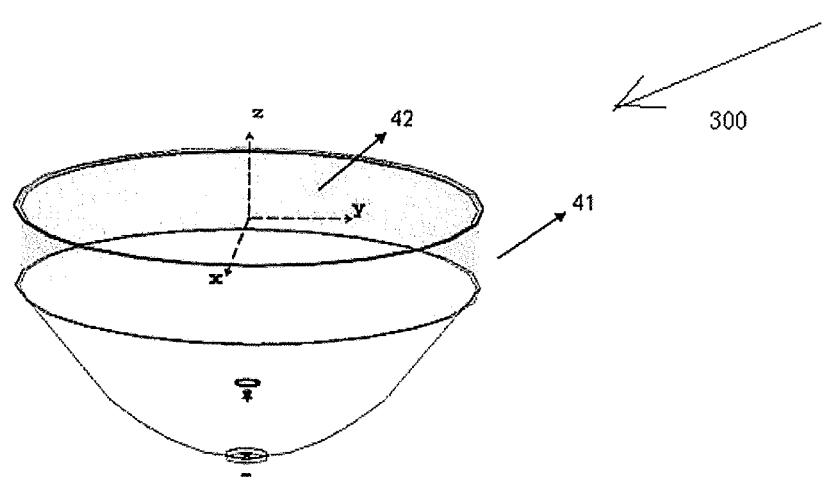
FIG. 4 illustrates an antenna aperture in a Cartesian coordinate system, according to one embodiment.

FIG. 4 illustrate a three dimensional view of a model antenna 41 in a Cartesian coordinate system x-y-z. The model antenna 41 can be, for example, the antenna 200 of FIG. 2, the antenna 300 of FIG. 3, or other types of microwave antennas. An upmost surface 42 of the antenna 41 is considered as an antenna aperture that is in the x-y plane. Microwave signals can be transmitted across the antenna aperture 42 along the z direction and have an aperture filed distribution thereon. Referring back to FIGS. 2 and 3, an upper edge of the shroud 24 or 34 defines an antenna aperture. The effective foci 35 of the antenna 300 have a displacement or offset in the x-y plane with respect to the z axis.

In the embodiments described herein, a method called aperture field synthesis is used to optimize the overall performance of a microwave antenna. According to the theory of antenna design, a far field radiation pattern of a microwave antenna is a spacial Fourier transform of an aperture field distribution, such as the aperture field distribution across the antenna aperture 42 of FIG. 4. The aperture field distribution includes an amplitude distribution and a phase distribution. It is the aperture field distribution across the antenna aperture that determines the final behavior of the radiation pattern of the microwave antenna.

The aperture filed distribution can be calculated using structural parameters of the antenna as input. The structural parameters include, for example, the distance 2s between the antenna feed 22 and the vertex 213 of the reflector 21 of FIG. 2, the diameter 3d of the circular range of the effective foci 35, the diameter 3w of the matching component 37, the distance 3h between the matching component 37 and the effective foci 35 along the central axis Z, and the distance 3h between the matching component 37 and the antenna feed 32 along the central axis are determined according to the aperture field distribution. It is to be understood that any structural parameter that may alter the geometry of the antenna can be used.

Figure 5:
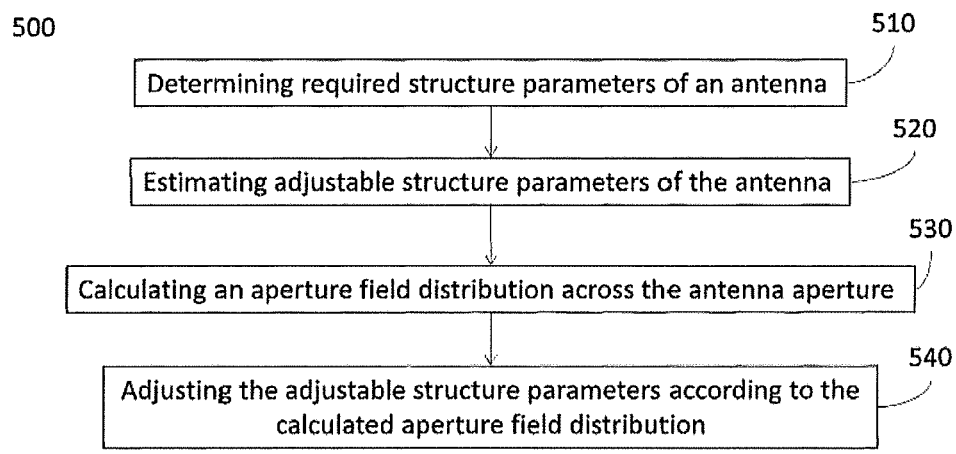
FIG. 5 shows a flow diagram of a method of optimizing performance of a microwave antenna, according to one embodiment.

FIG. 5 shows a flow diagram of a method 500 for optimizing the performance of a microwave antenna, according to one embodiment. At 510, required structure parameters of the antenna are determined. The required structural parameters include, for example, the dimension or diameter of an antenna aperture, the height of a shroud, a foci-to-diameter ratio of a primary reflector, etc. In some embodiments, based on the radiation efficiency of the antenna and required gain value, the aperture dimension or diameter of the antenna can be determined using an analytical method that is known in the art. In some embodiments, based on the required structure outlook constraints, the height of a shroud, such as the shrouds 23 and 33, and a foci-to-diameter ratio of a primary reflector, such as the primary reflector 21 and 31, can be defined. The method 500 then proceeds to 520.

At 520, adjustable structural parameters of the antenna are estimated. In some embodiments, initial values for the adjustable structural parameters can be selected randomly or based on previous known experience. The adjustable structural parameters include, for example, the diameter of effective foci, such as the effective foci 35, parameters of a matching component such as the matching component 37, etc. The parameters of a matching component include, for example, the diameter thereof, the cross-sectional profile, the distance from the matching component to the effective foci, etc. The method 500 then proceeds to 530.

At 530, an aperture field distribution across the antenna aperture is calculated. The aperture field distribution includes an amplitude distribution and a phase distribution. In some embodiments, a Finite Discrete Time Domain (FDTD) full wave simulation can be used to acquire related aperture field information, for example, the aperture field distribution, with one or more of the above structural parameters of the antenna as the input. It is to be understood that other suitable computer-based simulation techniques or methods can be used to calculate the aperture field distribution. The method 500 then proceeds to 540.

At 540, the adjustable structural parameters are adjusted to according to the calculated aperture field distribution. In some embodiments, the aperture field distribution can be recalculated until the resulting aperture field distribution satisfies user's requirements. In some embodiments, the diameter of the effective foci circle can be adjusted until improved aperture amplitude and phase distributions are achieved. In some embodiments, the parameters of the matching component including its diameter, cross-sectional profile and distance to effective foci to achieve can be adjusted to further improve the aperture amplitude and phase distributions.

The method 500 can optimize the performance of a microwave antenna by tuning the above mentioned structural parameters numerically without experiments. The methods described herein can overcome a few shortcomings of traditional feed radiation analysis method. While the classical way of pattern analysis of the feed itself may be helpful, it has limited guidance for a final radiation behavior of the complete antenna. This is especially true for those deep reflector antennas of small foci-to-diameter (F/D) ratio. For deep reflectors, the non-linear coupling between the feed and the reflector becomes dominant. The radiation information of the feed itself tells little of the final coupling result. Thus, experimental verification is needed for tuning the structural parameters of the antenna for the final antenna design. The methods described herein can be based on full wave calculations and have taken consideration the mutual couplings between feeds, reflectors and/or other subcomponents of a microwave antenna. Thus, the methods described herein can provide much more powerful and fertile way of optimizing the performance of microwave antennas.

In order to show the effects of antenna's configurations on the performance of the model antenna 41, three types of microwave antennas, cases 1-3, were prepared and the respective performances were compared. In the comparison, the microwave antennas, i.e., the cases 1-3, each have an antenna aperture of 0.6 meter diameter. It is to be understood that the microwave antennas can have other allowable values of antenna aperture.

The case 1 represents the antenna 200 of FIG. 2 that has a standard parabolic primary reflector 21. The case 2 is similar to the case 1 except for replacing the primary reflector 21 with the primary reflector 31 of the antenna 300 of FIG. 3. That is, the primary reflector in the case 2 has effect foci that are offset or displaced from the central axis Z' of the antenna and a hole defined at a bottom center portion. There is no matching component in the case 2. It is to be understood that the hole in the case 2 may have different dimensions compared to the hole 312 in the primary reflector 31. The case 3 represents the antenna 300 of FIG. 3 that includes the primary reflector 31 and the matching component 37. All three cases have a y-axis polarization (Ey), adopting the Cartesian coordinate system x-y-z shown in FIG. 4.

Figure 6:
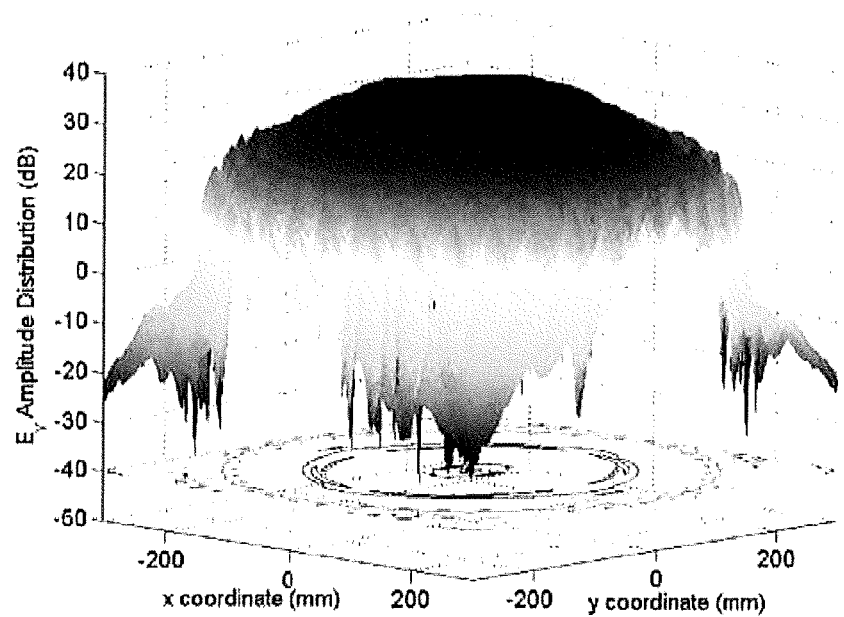
FIG. 6 illustrates a spacial 2D field amplitude distribution across an antenna aperture, according to one embodiment.

FIG. 6 demonstrates an example of the spacial 2D field amplitude distribution across the antenna aperture 42 defined in FIG. 4. In the following FIGS. 7-12, primary polarizations and co-polar radiation patterns will be illustrated as representative field components, where primary field distribution in both amplitude and phase for each cases 1-3 are shown.

Figure 7:
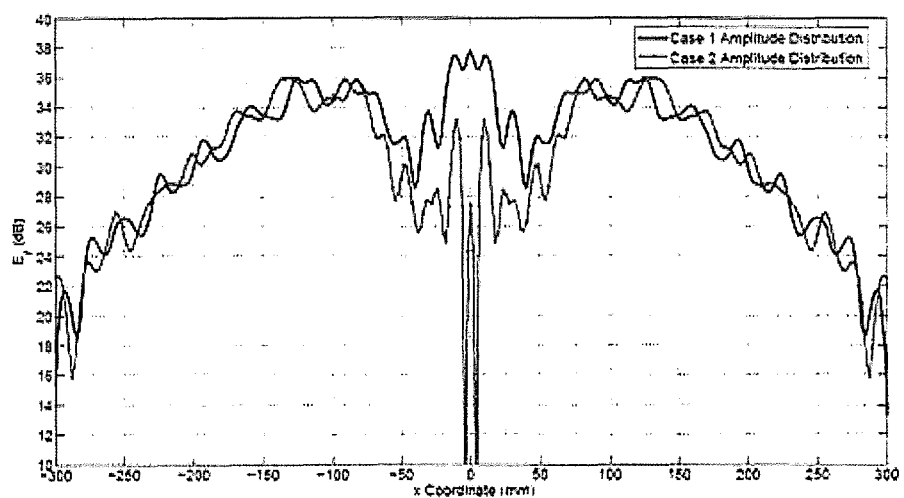
FIG. 7 illustrates an aperture primary plane Ey amplitude comparison between cases 1 and 2, according to one embodiment.
Figure 8:
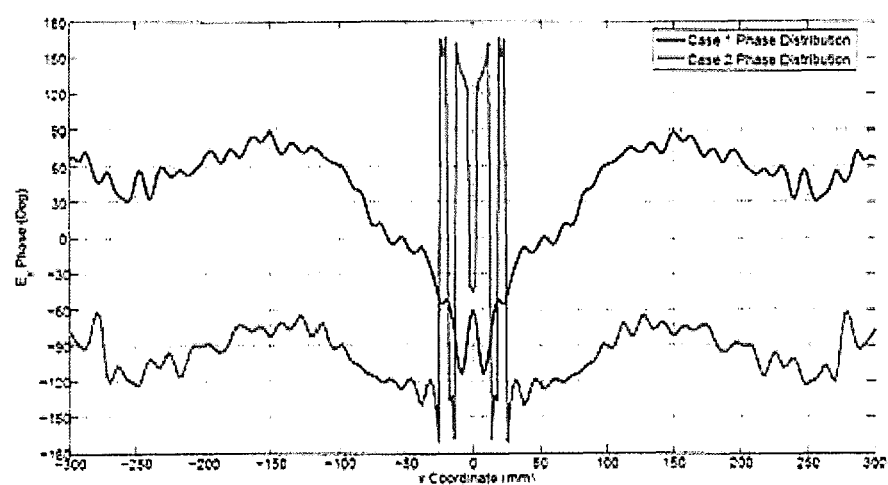
FIG. 8 illustrates an aperture primary plane By phase comparison between cases 1 and 2, according to one embodiment.
Figure 9:
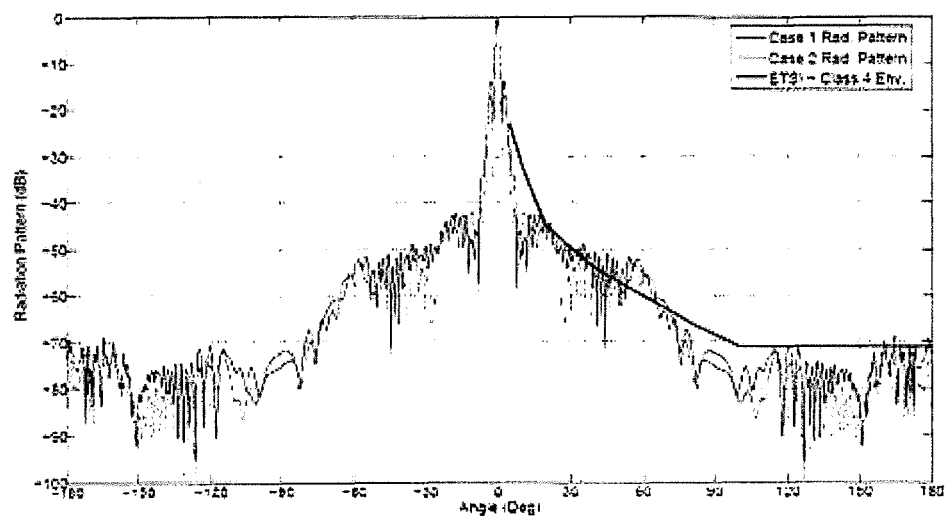
FIG. 9 shows the final co-polar radiation patterns of the cases 1 and 2, according to one embodiment.

FIGS. 7 and 8 demonstrate the aperture primary plane By amplitude and phase comparison between the cases 1 and 2. FIG. 8 shows final co-polar radiation patterns for the cases 1 and 2. As shown in FIG. 9, the case 1 has difficulty in meeting the ETSI class 4 requirement at the angular region between about 20 to about 70 degrees. By introducing a horizontal displacement factor of the parabolic reflector (i.e., the effect foci 35 are offset or displaced with respect to the central axis in the x-y plane), the case 2 could achieve shaper amplitude drop from x=+[0, 100 mm] without faltering much the phase distribution, as shown in FIG. 7 and FIG. 8. This has resulted in first SLL suppression by 2.5 dB over the case 1, as shown in FIG. 9. In addition, the radiation pattern at problematic region of about 30 to about 60 degrees also gets improved for the case 2.

Figure 10:
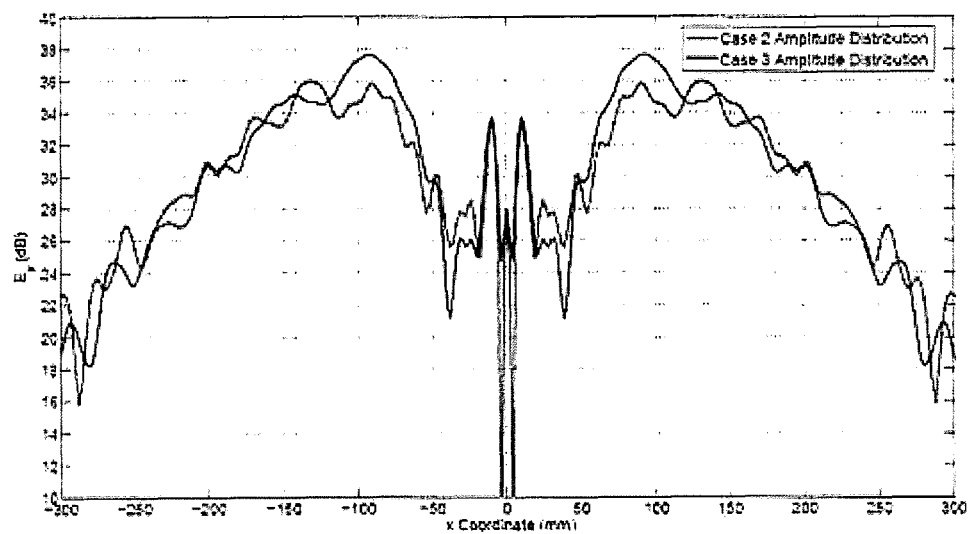
FIG. 10 illustrates an aperture primary plane By amplitude comparison between cases 2 and 3, according to one embodiment.
Figure 11:
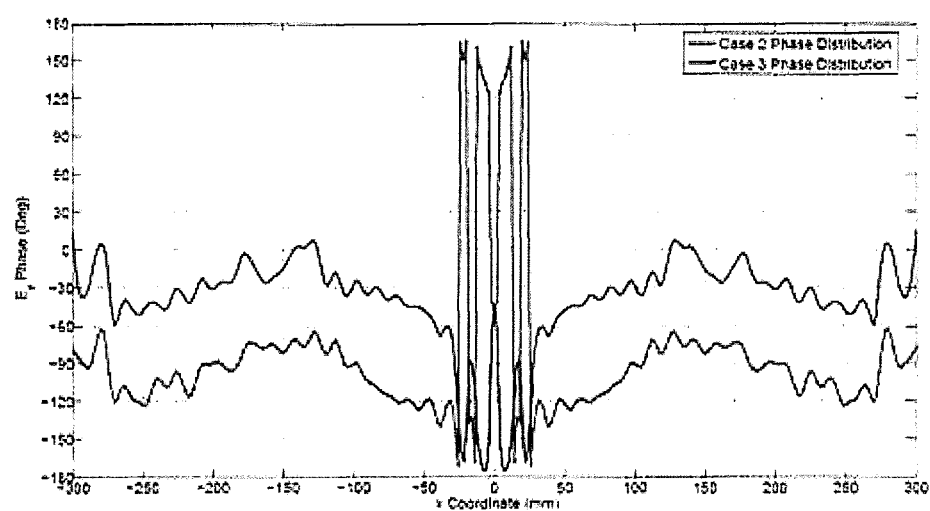
FIG. 11 illustrates an aperture primary plane Ey phase comparison between the cases 2 and 3, according to one embodiment.
Figure 12:
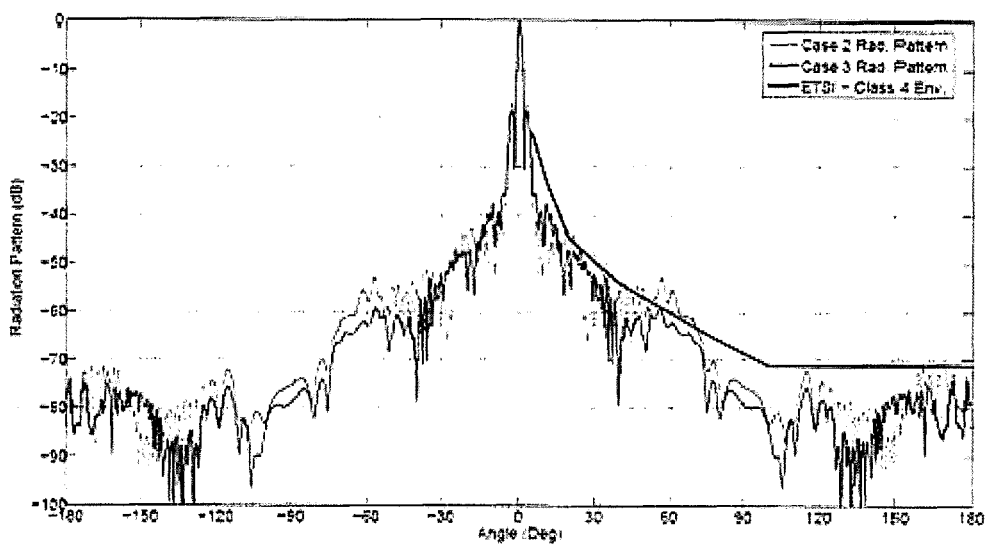
FIG. 12 shows the final co-polar radiation pattern of the cases 2 and 3, according to one embodiment.

FIGS. 10 and 11 demonstrate the aperture primary plane's By amplitude and phase comparison between the cases 2 and 3. FIG. 12 shows final co-polar radiation patterns for the cases 2 and 3. It is found that by introducing a matching component, such as the matching component 37 of FIG. 3, larger overall amplitude taper can be achieved in region x=±[80 mm, 300 mm], as shown in FIG. 10. The maximum field occurring at position x=90 mm has yielded larger taper and shaper drop for the two regions x<90 mm and x>90 mm According to Fourier calculation, this can result in even lower SLL and general pattern envelope. This was confirmed by FIG. 12 where the pattern for the case 3 was dramatically improved at angular region >20 degrees, meeting the outstanding requirement of ETSI class 4 envelopes. In addition, it is also worthwhile mentioning that the first SLL is further improved by 1 dB for the case 3 over the case 2.

It is evident from the above comparisons shown in FIGS. 7-12 that the microwave antenna 300 of FIG. 3 exhibits superior performance over the antenna 200 of FIG. 2. The displacement of foci and matching components were introduced primarily serving as perturbation of the primary reflector. It is also noted that the introduction of matching component 37 in FIG. 3 may have more significant impact over the displacement of parabolic curves. In addition, the aperture field analysis, as illustrated by the method 500, can offer a reference objective function for the optimization process.

It is noted that any of aspects 1-12 below can be combined with any of aspects 13-18.

1. A microwave antenna for a microwave communications system, comprising:
   an antenna feed configured to transmit/receive microwave signals; and
   a primary reflector having a concave surface facing the antenna feed and configured to reflect the microwave signals from/to the antenna feed, the antenna feed being positioned at a central axis of the concave surface, the primary reflector having an open edge that defines an aperture through which the microwave signals transmitted into or out of the microwave antenna,
   wherein the location of the antenna feed with respect to the primary reflector is determined according to an aperture field distribution of the microwave signals across the aperture.

2. The microwave antenna of aspect 1, wherein the concave surface is a substantially parabolic-shaped surface having effective foci offset from the central axis of the concave surface.

3. The microwave antenna of aspects 1-2, wherein the effective foci are positioned to form a generally circular or elliptic range around the central axis, and the primary reflector includes a hole defined at the bottom center portion thereof.

4. The microwave antenna of aspects 1-3, further comprising a matching component disposed at a bottom center portion of the primary reflector.

5. The microwave antenna of aspects 1-3, wherein the diameter of the circular range of the effective foci, the diameter of the matching component, the distance between the matching component and the effective foci along the central axis, and the distance between the matching component and the antenna feed along the central axis are determined according to the aperture field distribution of the microwave signals across the aperture.

6. The microwave antenna of aspect 1, further comprising a waveguide extending between a first end and a second end along the central axis of the concave surface, the first end being connected to the antenna feed, the second end extending through a bottom center portion of the primary reflector, the waveguide being configured to transmit/receive microwave signals to/from the antenna feed.

7. The microwave antenna of aspect 1, further comprising a shroud having a first edge attached to the open edge of the primary reflector, and an opposite second edge defines the aperture, an absorber attached to an inside surface of the shroud, and a radome attached to the second edge of the shroud.

8. The microwave antenna of aspect 1, wherein the aperture field distribution includes an amplitude distribution and a phase distribution.

9. The microwave antenna of aspects 1-4, wherein a discontinuity or a step is formed between the matching component and the primary reflector.

10. A microwave antenna for a microwave communications system, comprising:
 an antenna feed configured to transmit/receive microwave signals;
 a primary reflector having a concave surface facing the antenna feed and configured to reflect the microwave signals from/to the antenna feed, the antenna feed being positioned at a central axis of the concave surface, the primary reflector having an open edge that defines an antenna aperture at an open end thereof and a hole defined at a bottom center portion thereof opposite to the open end, and the concave surface is a substantially parabolic surface having effective foci displaced from the central axis;
 a waveguide extending between a first end and a second end thereof along the central axis, the first end being connected to the antenna feed, the second end extending through the hole of the primary reflector, the waveguide being configured to transmit/receive microwave signals to/from the antenna feed; and
 a matching component filling the hole of the primary reflector and facing the antenna feed, the waveguide extending through the matching component.

11. The microwave antenna of aspect 10, wherein the effective foci of the primary reflector are positioned to form a generally circular or elliptic range around the central axis.

12. The microwave antenna of aspect 10, wherein the matching component has a cross-sectional curve that is concaved toward the antenna aperture, and the cross-sectional curve includes linear or nonlinear, smooth or stepped lines.

13. A method for optimizing performance of a microwave antenna, comprising:
 estimating one or more structural parameters of the microwave antenna;
 calculating, using the estimated structural parameters as an input, an aperture field distribution of microwave signals transmitted by the microwave antenna across an aperture of the microwave antenna, the aperture field distribution including an amplitude distribution and a phase distribution, the calculation is implemented by a computer; and
 adjusting the structural parameters of the microwave antenna according to the calculated aperture field distribution.

14. The method of aspect 13, further comprising:
 modifying a primary reflector of the microwave antenna to have a substantially parabolic shape surface such that effective foci of the parabolic shape surface are displaced from a central axis thereof and are positioned to form a generally circular or elliptic range around the central axis, the primary reflector having an open edge that defines the aperture at an open end thereof and a substantially round hole defined at a bottom center portion thereof opposite to the open end.

15. The method of aspects 13-14, further comprising:
 filling the round hole of the primary reflector with a matching component, the matching component facing an antenna feed of the microwave antenna and having a cross-sectional curve including linear or nonlinear, smooth or stepped lines.

16. The method of aspects 13-14, wherein the structural parameters include at least one of the diameter of the effective foci, the diameter of the matching component, the distance between the matching component and the effective foci along the central axis, and the distance between the matching component and the antenna feed along the central axis.

17. The method of aspect 13, wherein estimating the structural parameters includes determining the dimension of the antenna, based on a required radiation efficiency gain value of the antenna.

18. The method of aspect 13, wherein estimating the structural parameters includes determining the height of a shroud and a foci-to-diameter ratio of an effective primary reflector, based on required structure outlook constraints on the antenna.

With regard to the foregoing description, it is to be understood that changes may be made in detail, especially in matters of the construction materials employed and the shape, size and arrangement of the parts without departing from the scope of the present invention. It is intended that the specification and depicted embodiment to be considered exemplary only, with a true scope and spirit of the invention being indicated by the broad meaning of the claims.

What is claimed is:

1. A microwave antenna for a microwave communications system, comprising:
 an antenna feed adapted to transmit/receive microwave signals;
 a primary reflector having a concave surface facing the antenna feed and a hole at a bottom center portion thereof, and adapted to reflect the microwave signals from/to the antenna feed, the concave surface is a substantially parabolic-shaped surface having effective foci displaced from a central axis of the concave surface, and
 a matching component including an adjustable structural parameter, the matching component being configured to fill the hole and have a cross-sectional profile that is concaved, facing the antenna feed, and adjust parabolic curves of the substantially parabolic-shaped surface of the primary reflector by adjusting the adjustable structural parameter,
 wherein the antenna feed is positioned at the central axis of the concave surface and adapted to transmit the microwave signals toward the concave surface or receive the microwave signals from the concave surface,
 wherein the primary reflector has an open edge that defines an aperture through which the microwave signals transmitted into or out of the microwave antenna, and
 wherein the location of the antenna feed with respect to the primary reflector is determined according to an aperture field distribution of the microwave signals across the aperture.

2. The microwave antenna of claim 1, wherein the effective foci are positioned to form a generally circular or elliptic range around the central axis.

3. The microwave antenna of claim 2, wherein the diameter of the circular range of the effective foci, the diameter of the matching component, the distance between the matching component and the effective foci along the central axis, and the distance between the matching component and the antenna feed along the central axis are determined according to the aperture field distribution of the microwave signals across the aperture.

4. The microwave antenna of claim 1, further comprising a waveguide extending between a first end and a second end along the central axis of the concave surface, the first end being connected to the antenna feed, the second end extending through a bottom center portion of the primary reflector, the waveguide being adapted to transmit/receive microwave signals to/from the antenna feed.

5. The microwave antenna of claim 1, further comprising a shroud having a first edge attached to the open edge of the primary reflector, and an opposite second edge defines the aperture, an absorber attached to an inside surface of the shroud, and a radome attached to the second edge of the shroud.

6. The microwave antenna of claim 1, wherein the aperture field distribution includes an amplitude distribution and a phase distribution.

7. The microwave antenna of claim 1, wherein a discontinuity or a step is formed between the matching component and the primary reflector.

8. A microwave antenna for a microwave communications system, comprising:
an antenna feed adapted to transmit/receive microwave signals;
a primary reflector having a concave surface facing the antenna feed and adapted to reflect the microwave signals from/to the antenna feed, wherein the antenna feed is positioned at a central axis of the concave surface and adapted to transmit the microwave signals toward the concave surface or receive the microwave signals from the concave surface, wherein the primary reflector has an open edge that defines an antenna aperture at an open end thereof and a hole defined at a bottom center portion thereof opposite to the open end, and wherein the concave surface is a substantially parabolic-shaped surface having effective foci displaced from the central axis;
a waveguide extending between a first end and a second end thereof along the central axis, the first end being connected to the antenna feed, the second end extending through the hole of the primary reflector, the waveguide being adapted to transmit/receive microwave signals to/from the antenna feed; and
a matching component adapted to fill the hole of the primary reflector and face the antenna feed, the matching component being configured to have a cross-sectional profile that is concaved facing the antenna feed, include an adjustable structural parameter, and adjust parabolic curves of the substantially parabolic-shaped surface of the primary reflector by adjusting the adjustable structural parameter, the waveguide extending through the matching component.

9. The microwave antenna of claim 8, wherein the effective foci of the substantially parabolic-shaped surface of the primary reflector are positioned to form a generally circular or elliptic range around the central axis.

10. The microwave antenna of claim 8, wherein the cross-sectional profile includes linear or nonlinear, smooth or stepped lines.

11. A method for optimizing performance of a microwave antenna, comprising:
estimating one or more adjustable structural parameters of the microwave antenna;
calculating, using the estimated adjustable structural parameters as an input and a full wave electromagnetic simulation method, an aperture field distribution of microwave signals transmitted by the microwave antenna across an aperture of the microwave antenna, the aperture field distribution including an amplitude distribution and a phase distribution; and
adjusting the adjustable structural parameters of the microwave antenna according to the calculated aperture field distribution
wherein the microwave antenna includes:
an antenna feed adapted to transmit/receive microwave signals,
a primary reflector including a concave surface facing the antenna feed, an open edge that defines the aperture at an open end thereof and a substantially round hole defined at a bottom center portion thereof opposite to the open end, the concave surface being a substantially parabolic-shaped surface having effective foci displaced from a central axis of the concave surface, and
a matching component having an adjustable structural parameter and filling the substantially round hole of the primary reflector, and
wherein adjusting the adjustable structural parameters of the microwave antenna includes adjusting parabolic curves of the substantially parabolic-shaped surface of the primary reflector by adjusting the adjustable structural parameter of the matching component.

12. The method of claim 11, wherein the matching component faces an antenna feed of the microwave antenna and has a cross-sectional curve including linear or nonlinear, smooth or stepped lines.

13. The method of claim 11, wherein the adjustable structural parameters of the microwave antenna include at least one of the diameter of the effective foci, the diameter of the matching component, the distance between the matching component and the effective foci along the central axis, and the distance between the matching component and the antenna feed along the central axis.

14. The method of claim 11, wherein estimating the adjustable structural parameters of the microwave antenna includes determining the dimension of the antenna, based on a required radiation efficiency gain value of the antenna.

15. The method of claim 11, wherein estimating the adjustable structural parameters of the microwave antenna includes determining the height of a shroud and a foci-to-diameter ratio of an effective primary reflector, based on required structure outlook constraints on the antenna.

* * * * *